US006404931B1

(12) United States Patent
Chen et al.

(10) Patent No.: US 6,404,931 B1
(45) Date of Patent: Jun. 11, 2002

(54) CODE BOOK CONSTRUCTION FOR VARIABLE TO VARIABLE LENGTH ENTROPY ENCODING

(75) Inventors: Wei-ge Chen, Issaquah; Ming-Chieh Lee, Bellevue, both of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/211,532

(22) Filed: Dec. 14, 1998

(51) Int. Cl.[7] .................................................. G06K 9/36
(52) U.S. Cl. ......................................... 382/239; 341/67
(58) Field of Search ................................ 382/246, 238, 382/244, 247, 253; 348/422, 397; 369/13; 704/229, 200.1, 205; 375/240.16, 240.28; 341/67, 66, 65, 79, 82, 83, 106, 107, 60

(56) References Cited

U.S. PATENT DOCUMENTS

| 4,122,440 A | 10/1978 | Langdon, Jr. et al. ......... 341/51 |
| 4,464,650 A | 8/1984 | Eastman et al. .............. 341/51 |
| 4,558,302 A | 12/1985 | Welch .......................... 341/51 |
| 4,706,265 A | 11/1987 | Furukawa ................... 375/241 |
| 4,744,085 A | 5/1988 | Fukatsu ...................... 714/746 |
| 5,003,307 A | 3/1991 | Whiting et al. ............... 341/51 |

(List continued on next page.)

FOREIGN PATENT DOCUMENTS

| EP | 0283735 A2 | 9/1988 |
| EP | 0462363 A2 | 12/1991 |
| EP | 0535571 A2 | 4/1993 |
| EP | 0540350 A2 | 5/1993 |
| EP | 0612156 A2 | 4/1994 |
| EP | 0830029 A2 | 3/1998 |

(List continued on next page.)

OTHER PUBLICATIONS

Rafael C. Gonzalez et al. Digital image processing, Addison–Wesley publishing company.pp. 339–359, 1992.*

Bell et al., Text Compression, "Contents," "Preface," "Chapter 8: Dictionary Techniques," "Chapter 9: Dictionary Coding Versus Statistical Coding," "References," Prentice Hall Advance Reference Series, pp. v–xi, xiii–xviii, 206–243, 244–273, 303–310 (1990).

Cohn et al., "Ziv–Lempel Compressors with Deferred Innovation," in Image and Text Compression, ed. James Storer, Kluwer Academic Publishers, pp. 145–158 (1992).

De Agostino et al., "Parallel Algorithms for Optimal Compression using Dictionaries with the Prefix Property," in Proc. Data Compression Conference '92, IEEE Computer Society Press, pp. 52–62 (1992).

Howard et al., "Practical Implementations of Arithmetic Coding," in Image and Text Compression, ed. James Storer, Kluwer Academic Publishers, pp. 85–112 (1992).

(List continued on next page.)

Primary Examiner—Joseph Mancuso
Assistant Examiner—Ali Bayat
(74) Attorney, Agent, or Firm—Klarquist Sparkman Campbell Leigh & Whinston, LLP

(57) ABSTRACT

A method of constructing a code book for groupings of symbols drawn from an alphabet, in which variable-sized groups of symbols are each assigned a variable length code based on probability of occurrence of symbol groupings. Code book entries are added by tentatively extending the high probability groupings with symbols from the alphabet. Code book size is restrained by identification of identify high probability symbol groupings, such that low probability groupings are combined into a single code book entry. Probability of occurrence for each entry is tracked. Extension and combination is repeated until a code book of predetermined size is reached. Each code book entry is assigned an entropy-type code according to the probability associated with each book entry.

28 Claims, 5 Drawing Sheets

U.S. PATENT DOCUMENTS

| | | | |
|---|---|---|---|
| 5,227,788 A | 7/1993 | Johnston et al. | 341/63 |
| 5,229,768 A | 7/1993 | Thomas | 341/51 |
| 5,254,990 A | 10/1993 | Yoshida | 341/51 |
| 5,400,075 A | 3/1995 | Savatier | |
| 5,406,279 A | 4/1995 | Anderson et al. | 341/51 |
| 5,442,350 A | 8/1995 | Iyer et al. | 341/51 |
| 5,479,562 A * | 12/1995 | Fielder et al. | 704/229 |
| 5,532,694 A | 7/1996 | Mayers et al. | 341/67 |
| 5,534,861 A | 7/1996 | Chang et al. | 341/79 |
| 5,550,541 A | 8/1996 | Todd | 341/51 |
| 5,579,430 A | 11/1996 | Grill et al. | 704/203 |
| 5,644,305 A | 7/1997 | Inoue et al. | 341/67 |
| 5,790,706 A | 8/1998 | Auyeung | 382/248 |
| 5,819,215 A | 10/1998 | Dobson et al. | 704/230 |
| 5,825,830 A | 10/1998 | Kopf | 375/340 |
| 5,831,559 A | 11/1998 | Agarwal et al. | 341/186 |
| 5,872,530 A | 2/1999 | Domyo et al. | 341/106 |
| 5,883,589 A | 3/1999 | Takashima et al. | 341/67 |
| 5,884,269 A | 3/1999 | Cellier et al. | 704/501 |
| 5,907,637 A | 5/1999 | Murashita | 382/239 |
| 5,933,104 A | 8/1999 | Kimura | 341/87 |
| 5,946,043 A | 8/1999 | Lee et al. | |
| 5,959,560 A | 9/1999 | Said et al. | 341/107 |
| 5,995,118 A | 11/1999 | Masuda | 345/467 |
| 6,029,126 A | 2/2000 | Malvar | 704/204 |
| 6,047,298 A | 4/2000 | Morishita | 707/532 |
| 6,052,150 A * | 4/2000 | Kikuchi et al. | 375/240.16 |
| 6,100,824 A | 8/2000 | MacLeod et al. | 341/51 |

FOREIGN PATENT DOCUMENTS

| | | |
|---|---|---|
| JP | 62247626 | 10/1987 |
| JP | 09232968 | 9/1997 |
| WO | WO 98/40969 | 9/1998 |

OTHER PUBLICATIONS

Image Processing Lab, City University of Hong Kong, "Auditory Predictive Lossy Lempel–Ziv Algorithm for Speech Coding: Theory," 40 pp. [online] [retrieved on Nov. 21, 2000 from http://www.image.cityu.edu.hk/~stkng/].

Semon, "The Effects of Cascading Popular Text Compression Techniques," M.S. Thesis, East Stroudsburg University, 102 pp. (May 1993).

Stauffer et al., "Dictionary Compression on the PRAM," Technical Report 94–7, University of California, Irvine, 19 pp. (Jan. 18, 1994).

Storer, "Massively Parallel Systolic Algorithms for Real–Time Dictionary–Based Text Compression," in *Image and Text Compression*, ed. James Storer, Kluwer Academic Publishers, pp. 159–178 (1992).

Williams, Ross, *Adaptive Data Compression*, Chapter 1, "Introductory Survey," Kluwer Academic Publishers, pp. 1–33 (1991).

Bailey et al., "Pipelining Data Compression Algorithms," *The Computer Journal*, vol. 33, No. 4, 6pp. (Aug. 1990).

Tewfik et al., "Enhanced Wavelet Based Audio Coder," Proc. ASILOMAR Conference, IEEE (1993).

ISO/IEC 13818–7: Information Technology—Generic coding of moving pictures and associated audio information—Part 7: Advanced Audio Coding, pp. I–iv, 1–147 (1997).

ISO/IEC 13818–7: Information Technology—Generic coding of moving pictures and associated audio information—Part 7: Advanced Audio Coding, Technical Corrigendum 1, pp. 1–22 (Dec. 1998).

Fabris et al., "Tunstall Adaptive Coding and Miscoding," IEEE Trans on Info. Theory, vol. 42, pp. 2167–2180 (1996).

Fogg, "Survey of Software and Hardware VLC Architectures," SPIE vol. 2186, pp. 29–37 (no date of publication).

Gibson et al., Digital Compression of Multimedia, "Lossless Source Coding," Chapter 2, pp. 17–62 (1998).

Gibson et al., Digital Compression of Multimedia, "Universal Lossless Source Coding," Chapter 3, pp. 62–112 (1998).

Gibson et al., Digital Compression of Multimedia, "MPEG Audio," Chapter 11.4, pp. 398–402 (1998).

Gibson et al., Digital Compression of Multimedia, "Advanced Audio Coding," Chapter 11.6.2, pp. 415–416 (1998).

International Organization for Standardisation ISO/IEC JTCI/SC29/WG11,N2459 "Overview of the MPEG–4 Standard," (Oct. 1998).

Jelinik et al., "On Variable–Length to Block Coding," IEEE Trans on Info. Theory, vol. 18, pp. 865–874 (1972).

Savari et al., "Generalized Tunstall Codes for Sources with Memory," IEEE Trans. On Info. Theory, vol. 43, pp. 658–668 (1997).

Video Coding For Low Bitrate Communication, "Line Transmission of Non–Telephone Signals," Telecommunication Standardization Sector of International Telecommunication Union, Dec. 5, 1995, pp. 22–23.

Allen Gersho and Robert M. Gray, Vecto Quantization and Signal Compression, "Entropy Coding," 1992, Chap. 9, pp. 259–305.

"Information Technology—Very Low Bitrate Audio–Visual Coding," Part 3: Audio, ISo/JTC1/SC29, N2203, May 15, 1998, pp. 4–9, including section of Huffman Coding.

International Organisation for Standardisation Organisation Internationale De Normalisation, ISO/IEC JTC1/SC29/WG11, N2202, Coding of Moving Pictures and Audio, Tokyo, Mar. 1998.

Stanley N. Baron, Mark I. Krivocheev, "Coding the Audio Signal," *Digital Image and Audio Communications*, 1996, pp. 101–128.

* cited by examiner

| | | |
|---|---|---|
| 400 | A | 8/15 Expand |
| 402 | X0=B,C | 7/15 |

| | | |
|---|---|---|
| 406 | A | 2/9 |
| 408 | B | 4/9 Keep |
| 410 | C | 0/9 |

| | | |
|---|---|---|
| 408 | B | 4/9 Expand |
| 412 | X1=A,C | 2/9 |
| | X0 | 3/9 |

| | | |
|---|---|---|
| 414 | A | 1/8 Keep |
| 416 | B | 1/8 |
| 418 | C | 0/8 |
| | X1 | 2/8 |
| | X0 | 3/8 |

CODE BOOK CONSTRUCTION FOR VARIABLE TO VARIABLE LENGTH ENTROPY ENCODING

FIELD OF THE INVENTION

The invention generally relates to data compression, and more specifically relates to a form of entropy coding.

BACKGROUND

In a typical coding environment, input data is encoded by an encoder, transmitted over a communication channel (or simply stored), and decoded by a decoder. During encoding, an input signal is typically pre-processed, sampled, converted, compressed or otherwise manipulated into a form for transmission or storage. After transmission or storage, the decoder attempts to reconstruct the original input.

One fundamental limitation of this simple model is that a given communication channel has a certain capacity or bandwidth. Consequently, it is frequently necessary to reduce the information content of input data in order to allow it to be reliably transmitted, if at all, over the communication channel. When the input signal is composed of symbols having equally likely probability of occurring, then an optimal encoding is to use equal length code words, where each bit of an n-bit code allows distinguishing among $2^n$ equally probable input possibilities. Thus, a single bit (i.e., single entry code book) can distinguish two possibilities, two bits can distinguish four possibilities, etc.

But, it is not typical that an input stream has equal probability of receiving any particular message. In practice, due to semantic or syntactic structure in the input, certain messages are more likely than others. The objective of entropy coding is to take advantage of such data correlation and minimize the average length of the code words among expected inputs having certain highly probable inputs. When one message is more likely than others, a shorter code book entry is used for probable messages, and longer entries for the less probable.

Over time, tremendous effort has been invested in developing lossless and lossy compression techniques for reducing the size of data to transmit or store. One popular lossless technique is known as Huffman encoding, which is a particular form of entropy encoding. Entropy encoding operates by assigning variable-length codes (e.g., code book entries) to fixed-sized blocks of input. That is, a random variable X, which is known to take on values $x_1 \ldots x_m$ with corresponding probability $p_1 \ldots p_m$, is mapped to an entry within a set of code words $\{Y\}$. Each code word $y_i^k$ in $\{Y\}$ of length k, in turn, consists of a finite sequence of code alphabet entries $\{A\}=\{a_1 \ldots a_d\}$. For simplicity, $y_i^k$ will be referenced simply as $y_i$, with k implied. For digital applications, the code alphabet is likely to be a series of binary digits $\{0, 1\}$, with code lengths measured in bits. It is assumed code words are constructed so only a single scan of a compressed representation needs to be inspected in order to reconstruct appropriate output. The difficulty in entropy encoding the source signal depends on the number m of possible values X may take. For small m, there are few possible messages, and therefore the code book for the messages can be very small (e.g., only a few bits need to be used to unambiguously represent all possible messages).

If it is known that a sender will provide a source signal containing one of four messages $x_1 \ldots x_4$, having respective probabilities $p_1 \ldots p_4$ of ½, ¼, ⅛, and ¹⁄₁₆, one can inefficiently represent the four possible messages with only two bits. However, this wastes bandwidth since the unequal probabilities indicate data characteristics than can be taken advantage of. A more efficient method, known as scalar Huffman encoding, requires an average of fewer than 2 bits to encode each message. A short code book entry is assigned to $x_1$, since it is most probable, and increasingly longer codes for the less probable inputs. One possible set of code book entries is assigning "1" to represent message $x_1$, "01" for message $x_2$, "000" for message $X_3$, and "001" for message $X_4$. This gives an average code length of 1.56 bits instead of 2 for encoding the random variable X—a significant savings.

The compression performance of this approach is limited virtue of each source symbol being assigned a code word with an integer number of bits. Traditional methods of overcoming this limitation include arithmetic coding and vector Huffman coding. These methods group X's together into blocks or vectors which are themselves treated as another source symbol. That is, instead of simply encoding each individual message X, instead sequences of multiple X's are encoded. Just as the individual symbol encoding methods take advantage of a symbol's frequency of occurrence in an input stream, this latter approach of grouping symbols allows the encoder to take advantage of dependencies between input symbols. Coding sequences of X's produces further savings as it is known from information theory studies that the entropy of a coherent series $X_1 \ldots X_n$ is less than or equal to the sum of each individual X's entropy.

Theoretically, vector Huffman coding can compress a coherent source much more efficiently than scalar Huffman coding. The efficiency of vector Huffman coding is only limited by practical concerns. In order to achieve higher compression ratios, bigger vector dimensions are needed. Higher dimension, however, increases code book sizes beyond practical limits. For example, for source symbols having 30 possible values, a dimension of only 6 corresponds to a code book of 729 million entries.

Note also that the above examples of entropy coding are characterized as fixed-to-variable length coding as the source symbols have fixed length and the code words have variable length depending on the probability of the corresponding source symbol. Another methods of entropy coding have been attempted which attempt the opposite approach, where a variable number of source symbols are grouped together and then translated into code words having equal length. When the source is composed of independent X's, and symbol groupings achieve equal probability, such a reverse scheme is provably optimal. However, as with large dimension vector Huffman encoding, such solutions require resources exceeding resources practically (if at all) available. Additionally, for sources with data coherence, such as audio or visual data streams, this variable-to-fixed length approach is not useful.

SUMMARY

The invention relates to a method of assigning variable length codes to variable length input sequences. In particular, entropy-type codes are assigned to probable input sequences, thus allowing a particular input stream to be encoded in a compressed format. When the invention is implemented in a resource-limited environment, it may be configured so as to reduce the size of the code book required for performing encoding and decoding. For example, variable length code words might only be assigned to inputs that are highly probable, and where default codes can be assigned to less probable sequences. The degree of probability required for assignment of a specific code to a specific input is adjusted according to a desired code book size.

The input stream to encode can be of any data type, such as numbers, characters, or a binary data stream which encodes audio, video or other types of data. For simplicity, the input stream is referenced herein as a series of symbols, where each "symbol" refers to the appropriate measurement unit for the particular input.

In particular, a code book is constructed for groupings of symbols, in which variable-sized groups of symbols are each assigned a variable length code based on probability of occurrence of symbol groupings. To construct the code book, possible groupings of symbols are generated and compared against the probability of the generated grouping occurring in exemplary input used to generate the code book. Such exemplary input is assumed to approximate arbitrary input likely to be received and require encoding. Note that the input may be used to drive generation of groupings, or all possible groupings can be tested and compared against the exemplary input; it is assumed herein that the groupings are input driven.

A data structure (or equivalent) may be used to track symbols combinations (e.g., the groupings). This structure is used to associate the new symbol with previously received symbols, so that arbitrarily long groupings of previously received symbols are tracked. One possible configuration for the data structure is a tree-type data structure, in which successive symbol groupings form new leaf nodes. These nodes may contain an entire grouping or just the single symbol extension to a previous parent node. In this latter configuration, the path from the root of the tree corresponds to a particular grouping.

In order to start the grouping and probability assignments, preferably one or more trivial groupings are selected, such as single symbol "groups" containing symbols from the input alphabet. The probability of these initial groupings is evaluated to determine the grouping most likely to occur as input, where such probability is necessarily computed with respect to exemplary inputs. The most probable grouping is then expanded with symbols from the alphabet to form tentative groupings. The probability of these tentative groupings is then evaluated to identify the most probable tentative expansions, and the least probable groupings combined into a single grouping.

The concept of a code book is to assign code words to symbol groupings. In a resource limited environment, the invention can be configured so that code book size is restricted. One method of doing so is avoiding assigning codes to all input sequences. Instead, only probable input sequences are stored in the code book and assigned an entropy-type code. Improbable sequences are represented in the code book as an input sequence prefix followed by a special expansion character suffix. This suffix character represents all possible input sequence extensions to the prefix. The prefix-suffix pairing represents all possible input sequences beginning with the prefix that do not have an entry in the code book. Thus, after evaluating the tentative extensions, two code book entries result, one for the most probable extension, and one to represent all other extensions (again, assuming only keeping one most probable extension).

This process of expanding groupings and collapsing groupings is repeated until the data structure has been filled to a predetermined capacity. However, even if the code book has been filled to capacity, note that the input may be continued to be scanned so that higher probability entries within the input displace less probable current entries. The efficiency of this coding technique is only limited by the book size selected and the typically of the exemplary input. Once the code book has been created, each book entry is assigned a entropy-type code, i.e., a code having a length inversely proportional to the entry's probability.

DETAILED DESCRIPTION

The invention has been implemented in an audio/visual codec. This is only one example of how the invention may be implemented. The invention is designed to be utilized wherever entropy-type coding may be utilized, and is applicable to compression of any type of data. Briefly described, optimal entropy encoding requires excessive resources, and the illustrated embodiments provide a nearly optimal encoding solution requiring far fewer resources.

Exemplary Operating Environment

Figure 1:
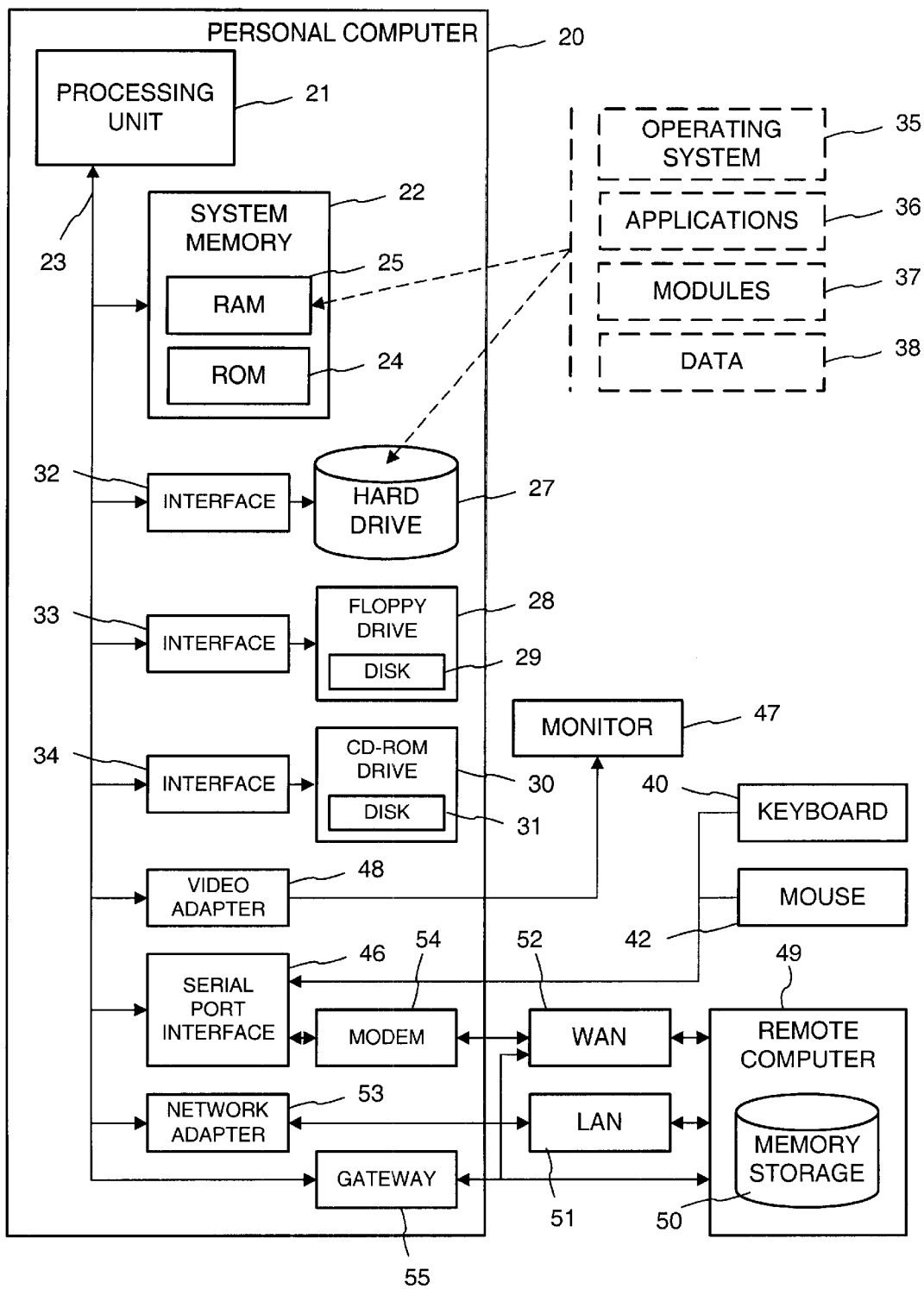
FIG. 1 is a block diagram of a computer system that may be used to implement a variable to variable entropy encoding.

FIG. 1 and the following discussion are intended to provide a brief, general description of a suitable computing environment in which the invention may be implemented. While the invention will be described in the general context of computer-executable instructions of a computer program that runs on a personal computer, those skilled in the art will recognize that the invention also may be implemented in combination with other program modules. Generally, program modules include routines, programs, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The illustrated embodiment of the invention also is practiced in distributed computing environments where tasks are performed by remote processing devices that are linked through a communications network. But, some embodiments of the invention can be practiced on stand alone computers. In a distributed computing environment, program modules may be located in both local and remote memory storage devices.

With reference to FIG. 1, an exemplary system for implementing the invention includes a computer 20, including a processing unit 21, a system memory 22, and a system bus 23 that couples various system components including the system memory to the processing unit 21. The processing unit may be any of various commercially available processors, including Intel x86, Pentium and compatible microprocessors from Intel and others, the Alpha processor by Digital, and the PowerPC from IBM and Motorola. Dual microprocessors and other multi-processor architectures also can be used as the processing unit 21.

The system bus may be any of several types of bus structure including a memory bus or memory controller, a peripheral bus, and a local bus using any of a variety of conventional bus architectures such as PCI, AGP, VESA, Microchannel, ISA and EISA, to name a few. The system memory includes read only memory (ROM) 24 and random access memory (RAM) 25. A basic input/output system (BIOS), containing the basic routines that help to transfer information between elements within the computer 20, such as during start-up, is stored in ROM 24.

The computer 20 further includes a hard disk drive 27, a magnetic disk drive 28, e.g., to read from or write to a removable disk 29, and an optical disk drive 30, e.g., for reading a CD-ROM disk 31 or to read from or write to other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of data, data structures, computer-executable instructions, etc. for the computer 20. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment.

A number of program modules may be stored in the drives and RAM 25, including an operating system 35, one or more application programs (e.g., Internet browser software) 36, other program modules 37, and program data 38. A user may enter commands and information into the computer 20 through a keyboard 40 and pointing device, such as a mouse 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The computer 20 is expected to operate in a networked environment using logical connections to one or more remote computers, such as a remote computer 49. The remote computer 49 may be a web server, a router, a peer device or other common network node, and typically includes many or all of the elements described relative to the computer 20, although only a memory storage device 50 has been illustrated in FIG. 1. The computer 20 can contact the remote computer 49 over an Internet connection established through a Gateway 55 (e.g., a router, dedicated-line, or other network link), a modem 54 link, or by an intra-office local area network (LAN) 51 or wide area network (WAN) 52. It will be appreciated that the network connections shown are exemplary and other means of establishing a communications link between the computers may be used.

In accordance with the practices of persons skilled in the art of computer programming, the present invention is described below with reference to acts and symbolic representations of operations that are performed by the computer 20, unless indicated otherwise. Such acts and operations are sometimes referred to as being computer-executed. It will be appreciated that the acts and symbolically represented operations include the manipulation by the processing unit 21 of electrical signals representing data bits which causes a resulting transformation or reduction of the electrical signal representation, and the maintenance of data bits at memory locations in the memory system (including the system memory 22, hard drive 27, floppy disks 29, and CD-ROM 31) to thereby reconfigure or otherwise alter the computer system's operation, as well as other processing of signals. The memory locations where data bits are maintained are physical locations that have particular electrical, magnetic, or optical properties corresponding to the data bits.

Figure 2:
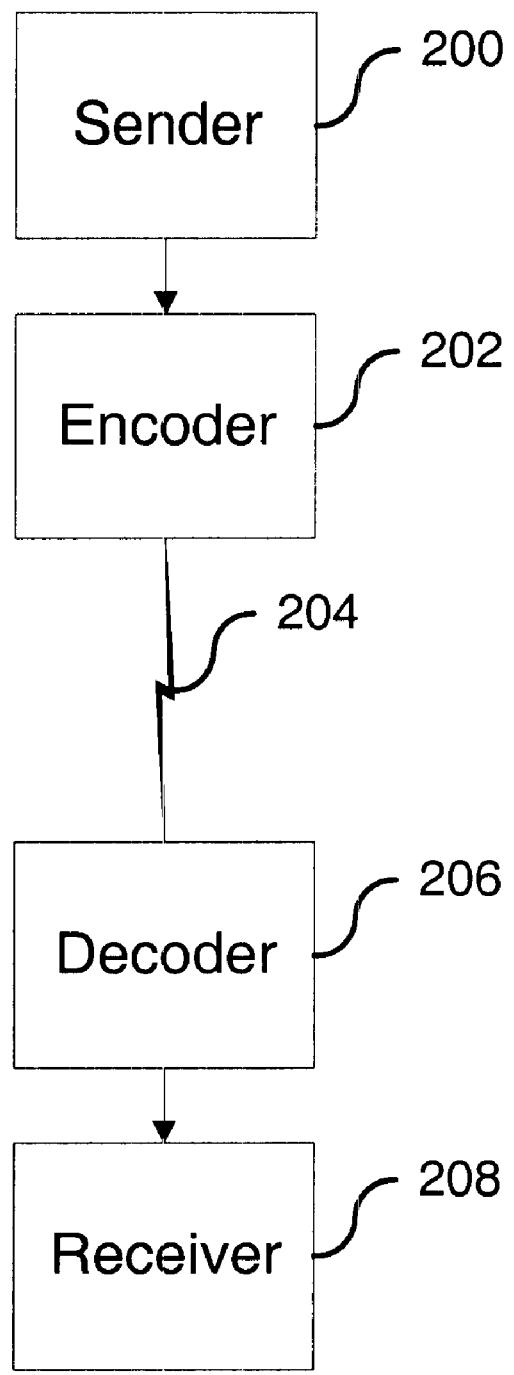
FIG. 2 shows a basic communication model.

FIG. 2 shows a basic communication model. In a basic communication model, there is a data source or sender 200, a communication channel 204, and a data receiver 208. The source may be someone speaking on a telephone, over telephone wires, to another person. Or, the source may be a television or radio broadcast transmitted by wireless methods to television or radio receivers. Or, the source may be a digital encoding of some data, whether audio, visual, or other, transmitted over a wired or wireless communication link (e.g., a LAN or the Internet) to a corresponding decoder for the information.

To facilitate transmission and receipt of the data, an encoder 202 is used to prepare the data source for transmission over the communication channel 204. The encoder is responsible for converting the source data into a format appropriate for the channel 204. For example, in the context of a common telephone call, one's voice is typically converted by the phone's handset from voice sounds to analog impulses that are sent as analog data to local telephone receiving equipment. This analog signal is then converted into digital form, multiplexed with numerous other conversations similarly encoded, and transmitted over a common line towards the receiver. Thus, in FIG. 2, the channel 204 corresponds in large part to a common pathway shared by multiple senders and receivers. At the receiving end 208, a decoder 206 is required to reverse the encoding process so as to present sensible data to the receiver.

In order to optimize the data transmission, the encoder 202 is frequently designed to utilize compression schemes for the transmission of the data. Compression is desirable since, except for unusual circumstances, communication bandwidth is limited. Therefore, for complex data sources, such as audio or video data, the source data needs to be compressed to allow its transmission over conventional transmission paths.

A particularly effective coding method is known as entropy encoding, which utilizes a "code book" containing short code words that have been pre-assigned to highly probable input data.

An effective coding method is entropy encoding. Such coders can capitalize on the data coherency, and are particularly effective when symbols have non-uniform probability distribution.

Figure 3:
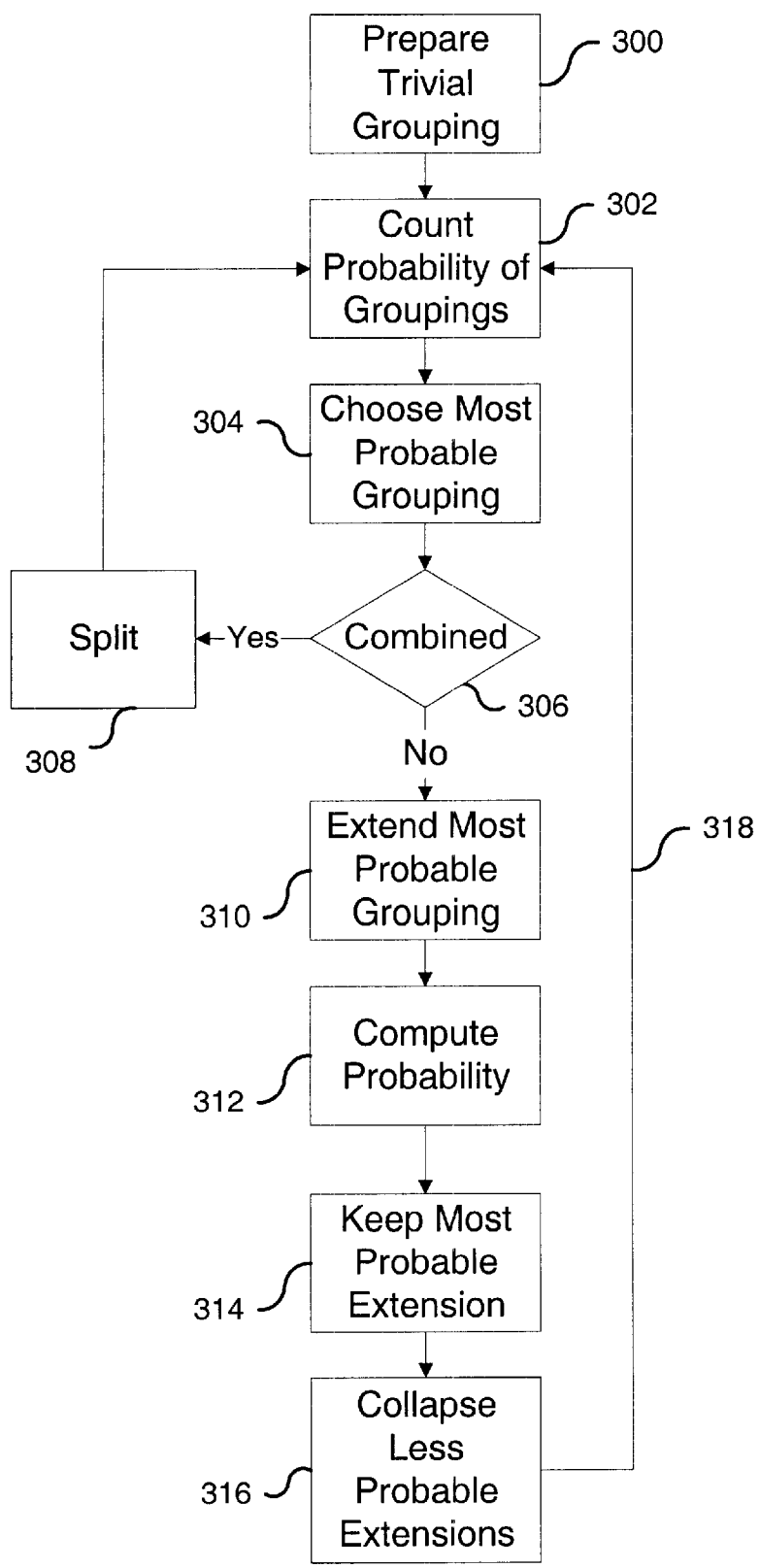
FIG. 3 is a flowchart showing creation of a code book having variable length entries for variable length symbol groupings.

FIG. 3 is a flowchart showing a preferred method for generating a code book. In particular, in contrast with prior art techniques, FIG. 3 illustrates how to create a code book having variable length code assignments for variable length symbol groupings. As discussed above, prior art techniques either require fixed-length codes or fixed blocks of input. Preferred implementations overcome the resource requirements of large dimension vector encoding, and the inapplicability of coding into words of equal lengths, by providing an entropy based variable-to-variable code, where variable length code words are used to encode variable length X sequences.

Let $y_i$ represent each source symbol group $\{x_j\}$, for 1 j $N_i$, having probability $P_i$ of occurring within the input stream (FIG. 2 channel 204), and that each group is assigned a corresponding code word having $L_i$ bits. It is presumed that each $x_j$ is drawn from a fixed alphabet of predetermined size. The objective is to minimize the $$L = \sum_i \frac{L_i * P_i}{N_i}.$$

Instead of finding a general solution to the problem, the problem is separated into two different tasks. The first task is identification of a (sub-optimal) grouping of a set of input symbols $\{x_i\}$ through an empirical approach described below. The second task is assigning a entropy-type code for the grouped symbols $\{y_i\}$. Note that it is known that if the source is not coherent (i.e., the input is independent or without memory), any grouping that has the same configuration of $\{N_j\}$ can achieve the same coding efficiency. In this situation, the first task becomes inconsequential.

To perform the first task, an initial trivial symbol grouping 300 is prepared, such as $\{y_i\}=\{x_i\}$. This initial configuration assumes that an exemplary input stream is being used to train creation of the code book. It is understood that a computer may be programmed with software constructions such as data structures to track receipt of each symbol from an input. Such data structures may be implemented as a binary-type tree structure, hash table, or some combination of the two. Other equivalent structures may also be used.

After determining the trivial grouping, the probability of occurrence for each $y_1$ is computed 302. Such probability is determined with respect to any exemplary input used to train code book generation. As further symbols are added to the symbol data structure, the probabilities are dynamically adjusted.

Next, the most probable grouping $y_i$ is identified 304 (denoted as $y_{mp}$). If 306 the highest probability symbol is a grouping of previously lower probability symbols, then the grouping is split 308 into its constituent symbols, and processing restarted from step 302. (Although symbols may be combined, the group retains memory of all symbols therein so that symbols can be extracted.)

If the symbol is not a grouping, then processing continues with step 310, in which the most probable grouping is then tentatively extended 310 with single symbol extensions $x_i$'s. Preferably $y_{mp}$ is extended with each symbol from the X alphabet is used. However, a predictor can be used to only generate an extension set containing only probable extensions, if the alphabet is very large and it is known many extensions are unlikely. For example, such a predictor may be based on semantic or contextual meaning, so that very improbable extensions can be ignored a priori.

The probability for each tentative expansion of $y_{mp}$ is then computed 312, and only the most probable extension retained 314. The rest of the lower probability extensions are collapsed together 316 as a combined grouping and stored in code book with a special symbol to indicate a combined grouping. This wild-card symbol represents any arbitrary symbol grouping having $y_{mp}$ as a prefix, but with an extension (suffix) different from the most probable extension. That is, if $y_{mp}+x_{mp}$ is the most probable root and extension, then the other less probable extensions are represented as $y_{mp}^*, * x_{mp}$. (Note that this discussion presumes, for clarity, serial processing of single-symbol extensions; however, parallel execution of multiple symbol extensions is contemplated.)

Code book construction is completed by repeating 318 steps 302–316 until all extensions have been made, or the number of code book entries reaches a predetermined limit. The effect of repeatedly applying the above operations is to automatically collect symbol groupings having high correlation, so that inter-group correlation is minimized. This minimizes the numerator of $$L = \sum_i \frac{L_i * P_i}{N_i},$$

while simultaneously maximizing the length of the most probable $y_i$ so that the denominator of L is maximized.

There are various techniques available for storing and manipulating the code book. One structure for a code book is traversal and storage of a N-ary (e.g., binary, tertiary, etc.) tree, where symbol groupings guide a traversal of the tree structure. Leaf nodes of the tree represent the end of a recognized symbol sequence, where an entropy-type code is associated with the sequence. Nodes can be coded in software as a structure, class definition, or other structure allowing storage of a symbol or symbols associated with the node.

Alternatively, the code book may be structured as a table having each string of input symbol sorted by probability of occurrence, with highly probable input at the top of the table. For large tables, the table can be sorted according to the first symbol, i.e., all symbol series beginning with "A" are grouped together, followed by series starting with "B", etc. With this arrangement, all entries within the grouping are sorted according to their probabilities of occurrence. The position of the beginning of each section is marked/tracked so that a hash-type function (e.g., a look-up based on the first symbol) can be used to locate the correct portion of the code book table. In this look-up table approach to storing the code book, once the first symbol is hashed, look-up simply requires a search of the corresponding table section until a matching entry is located.

FIGS. 4–10 illustrate creation of a code book pursuant to FIG. 3 for an alphabet $\{A, B, C\}$. For this discussion, the code book is defined with respect to an exemplary input stream "A A A B B A A C A B A B B A B". As discussed above, one or more exemplary inputs may be used to generate a code book that is then used by encoders and decoders to process arbitrary inputs. For clarity, the code book is presented as a tree structure, although it may in fact be implemented as a linear table, hash table, database, etc. As illustrated, the tree is oriented left-to-right, where the left column (e.g., "A" and "X0") represents the top row of a tree-type structure, and successively indented rows represent the "children" of the previous row's node (e.g., in a top-down tree for FIG. 5, node "A" is a first-row parent node for a second-row middle-child node "B".).

In preparing the code cook, the general rule is to pick the most probable leaf node, expand it, re-compute probabilities to determine the most probable leaf-node, and then compact the remaining sibling nodes into a single Xn node (n=0 . . . N, tracking each time nodes have been combined). If it turns out that the most probable node is a group node, then the group is split, probabilities recalculated, and the most probable member node retained (i.e., the remaining group members are re-grouped). Processing cycles until a stop state is reached, such as a code book having predetermined size.

Figure 4:
FIGS. 4–10 illustrate creation of a code book pursuant to FIG. 3 for an alphabet {A, B, C}.

FIG. 4 shows an initial grouping for the input stream "A A A B B A A C A B A B B A B". An initial parsing of the input shows probabilities of occurrence of A=8/15, B=6/15, and C=1/15. This initial trivial grouping can be created based on different criteria, the simplest being having a first-level node for every character in the alphabet. However, if the input alphabet is large, the trivial grouping may be limited to some subset of symbols having highest probability, where the remaining symbols are combined into an X grouping. FIG. 4 illustrates this technique by starting with only two initial groups, group A 400 having probability 8/15, and group X0 402 having probability 7/15, where X0 represents all remaining low probability symbols in the alphabet, e.g., B and C.

Figure 5:
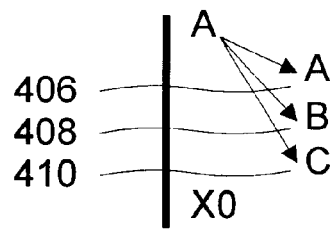

After preparing an initial trivial grouping, the leaf-node having highest probability is selected for extension (see also FIG. 3 discussion regarding processing sequence). Hence, as shown in FIG. 5, group A 400 is tentatively expanded by each character in the alphabet (or one may limit the expansion to some subset thereof as described for creating the initial grouping). Probabilities are then recomputed with respect to the input stream "A A A B B A A C A B A B B A B" to determine values for the tentative extensions A 406, B 408, and C 410. The result is nine parsing groups, where "A A" appears 2/9, "A B" appears 4/9, and "A C" appears 0/9. Therefore, the most probable extension "A B" is retained and the other extensions collapsed into X1=A,C. Note that although this discussion repeatedly recalculates all probabilities, a more efficient approach is to retain probabilities and symbol associations for each node within the node, and only computing information as necessary.

Figure 6:
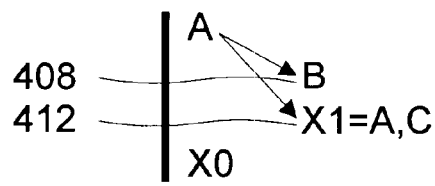

FIG. 6 shows the collapse into X1 412 for FIG. 5. Processing repeats with identification of the node having highest probability, e.g., node B 408 at probability 4/9.

Figure 7:
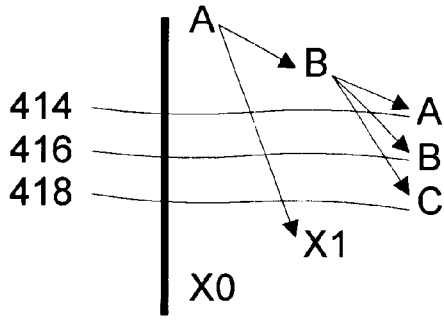

As shown in FIG. 7, this node 408 is tentatively extended with symbols A 414, B 416, C 418, and as discussed above, the tentative grouping with highest probability is retained. After recalculating probabilities, the result is eight parsing groups in which the symbol sequence "A B A" 414 appears once, "A B B" 416 appears once, and "A B C" 418 does not appear at all. Since tentative extensions A 414 and B 416 have the same probability of occurrence, a rule needs to be defined to choose which symbol to retain. For this discussion, whenever there are equal probabilities, the highest row node (e.g., the left-most child node in a top-down tree) is retained. Similarly, when there is a conflict between tree rows, the left-most row's node (e.g., the node closest to the root of a top-down tree) is retained.

Note that the above described parsing of the exemplary input does not account for the trailing two symbols "A B" of the input. As illustrated in FIG. 7, there is no leaf corresponding to "A B" as that configuration was expanded into "A B A", "A B B", and "A B C". To compensate, code book entries can be created to account for such end of input sequences, or the input having no entry can be escaped with a special character and inserted in the encoded output stream. For example, a special symbol can be used to indicate end of input, therefore implying how to handle the trailing characters on decoding.

Figure 8:
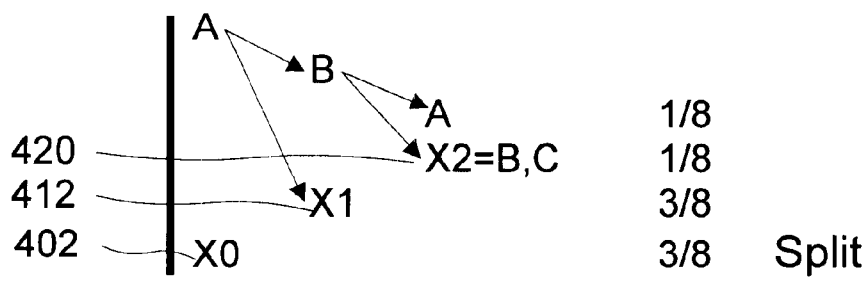

Thus, as shown in FIG. 8, node A 414 is retained and nodes B 416 and C 418 are combined into node X2=B,C 420, having combined probability of 1/8+0/8. Now, the next step is to expand the node currently having highest probability with respect to the input stream. As shown, nodes X1=A,C 412 and X0=B,C 402 have the same probability of occurrence (3/8). As discussed above, the highest node in the tree (X0 402) is extended. (Although it is only necessary to be consistent, it is preferable to expand higher level nodes since this may increase coding efficiency by increasing the number of long code words.)

Figure 9:
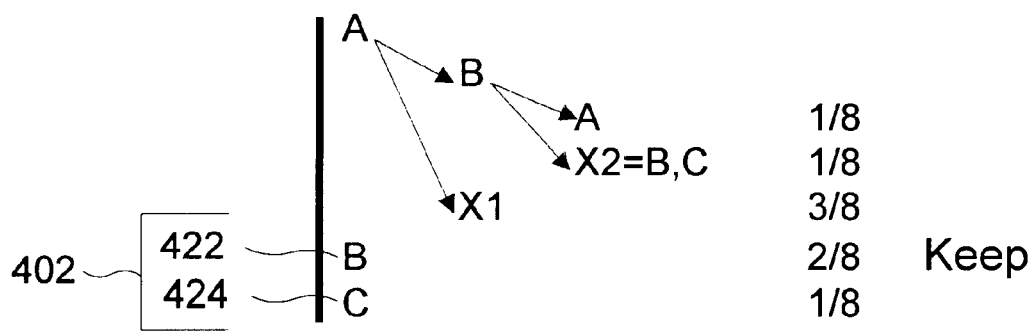

However, X0 402 is a combined node, so it must be split instead of extended. FIG. 9 illustrates the result of splitting node X0 into its constituent symbols B 422 and C 424. Recalculating probabilities indicates that symbol sequences "A B A" appears 1/8, "A B X2" appears 1/8, "A X1" appears 3/8, "B" 422 appears 2/8, and "C" appears 1/8. Since this is a split operation, the split node having highest probability, e.g, node B 422, is retained, and the remaining node(s) re-combined back into X0=C 424.

Figure 10:
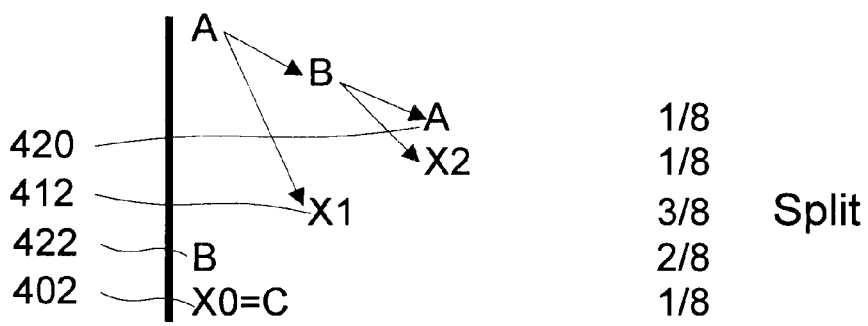

FIG. 10 shows the result of retaining high-probability node B 422. Note that grouping X0 now only represents a single symbol "C". After revising probabilities, the node having highest probability must be identified and split or extended. As shown, symbol sequence "A B A" appears 1/8, "A B X2" appears 1/8, "A X1" appears 3/8, "B" appears 2/8, and "X0" appears 1/8. Therefore node X1 412, as a combined node, must be split.

Splitting proceeds as discussed above, and processing the code book cycles as illustrated in FIG. 3, with highest probability nodes being extended or split until a stop state is reached (e.g., the code book reaches a maximum size). Note that for the FIG. 10 configuration, the average bits per input symbol, assuming fractional bits under ideal Huffman encoding of the leaf nodes, is approximately 0.8 bits/symbol (varies depending on how the trailing input "A B" is handled). This represents a significant (about 10%) savings over previous lossless compression techniques, such as ideal scalar Huffman encoding.

Having described and illustrated the principles of my invention with reference to an illustrated embodiment, it will be recognized that the illustrated embodiment can be modified in arrangement and detail without departing from such principles. Accordingly, what is claimed as the invention is all such modifications as may come within the scope and spirit of the following claims and equivalents thereto.

What is claimed is:

1. A method of constructing a code book for groupings of symbols drawn from an alphabet, in which variable size symbol groupings are each assigned a variable length code based on probability of occurrence of symbol groupings, comprising:

receiving a series of symbols from an input;

storing in a data structure plural variable size symbol groupings, each symbol grouping defined by one or more contiguous symbols, wherein parsing the received series of symbols according to the symbol groupings yields probabilities of occurrence for the symbol groupings throughout the received series, and wherein the parsing repeats plural times, the symbol groupings changing after each parsing based on said probabilities of occurrence throughout the received series;

assigning a variable length code for each symbol grouping based on a probability of occurrence of such symbol grouping in the received series; and outputting a code book that associates the symbol groupings with corresponding assigned codes for subsequent variable-to-variable compression.

2. A method according to claim 1, wherein the acts of the storing in a data structure are repeated until a code book having a predetermined number of entries is reached.

3. A method according to claim 2, wherein the received symbols are from an exemplary input.

4. A computer-readable medium storing computer-executable programming for performing the method of claim 1.

5. The method of claim 1 wherein the symbols are stored in a memory storage and adaptively grouped, the storage containing shorter symbol groupings defined by a symbol series of one or more symbols from the alphabet, and longer groupings defined by extending the symbol series of a shorter grouping with one or more symbols from the alphabet, and wherein the storing comprises:

forming an initial collection of shorter groupings;

selecting a shorter grouping;

defining longer groupings by extending the shorter grouping with extension symbols;

computing a probability of receiving each longer grouping from the input, so as to identify high probability and low probability groupings; and combining each low probability grouping into a combined grouping having the symbol series of the shorter grouping, and an expansion symbol representing any extension series except those of each high probability grouping.

6. A computer readable medium having stored thereon computer executable instructions for performing the method of claim 5.

7. The method of claim 1 wherein the symbols are stored in a hierarchical memory storage and adaptively grouped, a hierarchy in the storage having an initial hierarchy level containing initial groupings, where all groupings are defined by a symbol series of one or more symbols from the alphabet, and the hierarchy having sub-levels containing at least one sub-grouping for a parent grouping, each sub-grouping defined by extending the symbol series for the parent with one or more symbols from the alphabet, and wherein the storing comprises:

creating a new sub-level of a previous level in the hierarchy;

selecting a parent grouping from the previous hierarchy level;

defining an extension set of symbols having plural elements, each element defined by at least one symbol from the alphabet;

for each element of the extension set, defining a sub-group of the parent grouping by extending the symbol series for the parent grouping with such set element;

computing, for each defined sub-group, a probability of receiving such sub-group from the input;

identifying at least one high probability sub-group having a symbol series defined by a base symbol series common to each subgroup and a high-probability extension series of at least one symbol, where all other sub-groups are low probability; and combining each low probability sub-group into a combined grouping having a combined symbol series represented by the base symbol series and a special symbol representing any symbol series different from each high-probability extension series.

8. A computer readable medium having stored thereon computer executable instructions for performing the method of claim 7.

9. The method of claim 1 wherein the data structure stores n variable size symbol groupings, and wherein symbol groupings not represented in the data structure are encoded with an escape entry.

10. A method for creating a code book for compressing streaming data, such streaming data being represented by a series of symbols which are collected into variable length groupings of symbols that are each assigned a variable length code based on probability of occurrence such groupings in a typical data source, the method comprising:

storing such symbol groupings in a data structure having a dynamically allocable memory for storing the symbol groupings, where the data structure has different entropy codes assigned to each of a plurality of different input sequences;

identifying a symbol grouping having high probability;

expanding the symbol grouping into tentative groupings by adding a new symbol from the alphabet;

identifying a high probability tentative grouping;

combining all tentative groupings, except for the high probability tentative grouping, into a combined grouping;

storing the high probability tentative grouping in the data structure; and storing the combined grouping in the data structure.

11. A method according to claim 10, wherein the data structure is configured as a table having entries for storing each symbol grouping.

12. A method according to claim 10, in which the data structured is configured as a tree having nodes containing symbols, and wherein each symbol grouping is identified by a traversal path through the tree.

13. A method according to claim 10, further comprising the step of splitting the combined grouping if the combined grouping has high probability, such splitting comprising:

breaking apart the grouping into constituent symbols;

identifying a constituent symbol having high probability; and re-combining all constituent symbols except for the high probability constituent symbol.

14. The method of claim 10, wherein the streaming data is retrieved from a non-volatile storage medium.

15. A system for constructing a code book for groupings of symbols drawn from an alphabet, in which variable size symbol groupings are each assigned a variable length code based on probability of occurrence of symbol groupings, comprising:

an input for receiving a series of plural symbols;

a memory configured to contain a data structure for storing plural variable size symbol groupings, each symbol grouping defined by one or more contiguous symbols;

means for parsing a received series of plural symbols according to the symbol groupings, wherein the parsing yields probabilities of occurrence for the symbol groupings throughout the received series, and wherein the parsing repeats plural times, the symbol groupings changing after each parsing based on said probabilities of occurrence throughout the received series;

means for assigning a variable length code for each symbol grouping based on a probability of occurrence of such symbol grouping in the received series; and means for outputting a code book that associates the variable size symbol groupings with the assigned variable length codes for subsequent variable-to-variable compression.

16. A system according to claim 15, the system further comprising means for splitting a combined grouping into constituent symbols.

17. The system of claim 15 wherein the data structure stores n variable size symbol groupings, and wherein the data structure stores an escape entry for encoding symbol groupings not otherwise represented in the data structure.

18. A method of constructing a code book for groupings of symbols drawn from an alphabet, in which variable size symbol groupings are each assigned a variable length code based on probability of occurrence of symbol groupings, comprising:

receiving symbols from an input;

storing in a data structure variable size symbol groupings defined by contiguous symbols received from the input, wherein the storing comprises:

identifying a symbol grouping having high probability;

expanding the symbol grouping into tentative groupings by adding a new symbol from the alphabet;

identifying a high probability tentative grouping;

combining all tentative groupings, except for the high probability tentative grouping, into a combined grouping;

storing the high probability tentative grouping in the data structure; and storing the combined grouping in the data structure; calculating a probability for each of the symbol groupings; and assigning a variable length code for each symbol grouping.

19. A method according to claim 18, wherein if the symbol grouping having high probability is a combined grouping, then splitting the combined grouping into constituent symbols, identifying a constituent symbol having high probability, and re-combining all constituent symbols except for the high probability constituent symbol.

20. A computer-readable medium storing computer-executable programming for performing the method of claim 19.

21. A method according to claim 18, wherein the high probability tentative grouping is formed by the symbol grouping having high probability, followed by a most probable extension, and wherein the combined grouping is formed by the symbol grouping having high probability, followed by a special extension corresponding to any extension different than the most probable extension.

22. A method according to claim 21, wherein a combined grouping is stored within a data structure having a dynamically allocable memory for storing each symbol within the grouping.

23. A computer-readable medium storing computer-executable programming for performing the method of claim 18.

24. A system for constructing a code book for groupings of symbols drawn from an alphabet, in which variable size symbol groupings are each assigned a variable length code based on probability of occurrence of symbol groupings, comprising:

an input for receiving plural symbols;

a memory configured to contain a data structure for storing variable size symbol groupings deformed by contiguous symbols received from the input;

means for identifying a symbol grouping having high probability;

means for expanding the symbol grouping into tentative groupings by adding a new symbol from the alphabet;

means for identifying a high probability tentative grouping;

means for combining all tentative groupings, except for the high probability tentative grouping, into a combined grouping;

means for storing the high probability tentative grouping in the data structure;

means for storing the combined grouping in the data structure;

means for calculating a probability for each of the symbol groupings; and means for assigning a variable length code for each symbol grouping.

25. A system according to claim 24, further comprising means for splitting a combined grouping into constituent symbols if the combined grouping is the symbol grouping having high probability.

26. A computer readable medium having stored thereon computer executable instructions for constructing a code book for groupings of symbols drawn from an alphabet, the code book for variable-to-variable compression, the instructions for performing acts comprising:

initializing symbol groupings for parsing a series of symbols received from an input;

repeatedly, parsing the received series of symbols according to the symbol groupings, wherein the parsing yields probabilities of occurrence for the symbol groupings throughout the received series; and changing the symbol groupings based on said probabilities of occurrence throughout the received series;

assigning a variable length code for each symbol grouping based upon a probability of occurrence for such symbol grouping in the received series; and outputting a code book that associates the symbol groupings with corresponding assigned codes for subsequent variable-to-variable compression.

27. The computer readable medium of claim 26 wherein the repeated parsing and changing increases the average size of the variable size symbol groupings.

28. The computer readable medium of claim 26 wherein for a predetermined number of symbol groupings the repeated parsing and changing maximizes the average size of the variable size symbol groupings.

* * * * *